United States Patent [19]
Smayling et al.

[11] Patent Number: 5,648,275
[45] Date of Patent: Jul. 15, 1997

[54] METHOD FOR DETECTING DEFECTS IN SEMICONDUCTOR INSULATORS

[75] Inventors: Michael C. Smayling, Missouri City; Klaus A. Anselm, Austin, both of Tex.

[73] Assignee: Texas Instruments Incorporated, Dallas, Tex.

[21] Appl. No.: 482,382

[22] Filed: Jun. 7, 1995

Related U.S. Application Data

[62] Division of Ser. No. 109,202, Aug. 19, 1993.

[51] Int. Cl.$^6$ .................................................. H01L 21/66
[52] U.S. Cl. ............................................... 437/8; 437/7
[58] Field of Search .................... 437/7, 8, 238; 148/DIG. 162

[56] References Cited

U.S. PATENT DOCUMENTS

| | | | |
|---|---|---|---|
| 4,296,372 | 10/1981 | Feurebaum | 437/8 |
| 5,049,811 | 9/1991 | Dreyer et al. | 324/537 |
| 5,057,441 | 10/1991 | Gutt et al. | 437/8 |
| 5,420,513 | 5/1995 | Kimura | 324/719 |

OTHER PUBLICATIONS

Amberiadis, K. and Van Der Ziel, A., *1/f Noise in Diffused and Ion–Implanted MOS Capacitors*, Solid–State Electronics, vol. 26, No. 10, pp. 1009–1017, 1983. Printed in Great Britain.

Celik–Bulter, Z. and Hsiang, T.Y., *Spectral Dependence of 1/f Noise of Gate Bias in N–Mosfets*, Solid–State Electronics, vol. 30, No. 4, pp. 419–423, 1987. Printed in Great Britain.

Guttler, H.H. and werner, J.H., *Influence of barrier inhomogeneities on noise at Schottkey contacts*, Appl. Phys. Lett. 56 (12), 19 Mar. 1990, pp. 1113–1115.

Neri, *Low–frequency noise in silicon–gate metal–oxide–silicon capacitors before oxide breakdown*, Appl. Phys. Lett. 51 (25), 21 Dec. 1987, pp. 2167–2169.

Van Der Ziel, A., *Unified Presentation of 1/f Noise in Electronic Devices: Fundamental 1/f Noise Sources*, Proceedings of the IEEE, vol. 76, No. 3, Mar. 1988, pp. 233–258.

Wong, H. and Cheng, C., *gate dielectric–dependent flicker noise in metal–oxide–semiconductor transistors*, J. Appl. Phys. 67 (2), 15 Jan. 1990, pp. 863–867.

Young, K.K. and Hu, C., *Charge Transport and Trapping Characteristics in Thin Nitride–Oxide Stacked Films*, IEEE Electron Device Letters, vol. 9, No. 11, Nov. 1988, pp. 616–618.

*Primary Examiner*—Chandra Chaudhari
*Attorney, Agent, or Firm*—Gerald E. Laws; C. Alan McClure; Richard L. Donaldson

[57] ABSTRACT

The reliability of thin film insulators is determined with noise measurements which find the barrier height mean and standard deviation. A constant voltage source is applied across the thin film insulator. A low noise amplifier is connected across a resistor which is in series with the insulator. A spectrum analyzer is connected to the low noise amplifier. The power density is obtained by observing the output of a spectrum analyzer. The current spectral density is compared to a predetermined reference to detect the presence of defects in the insulator.

4 Claims, 5 Drawing Sheets

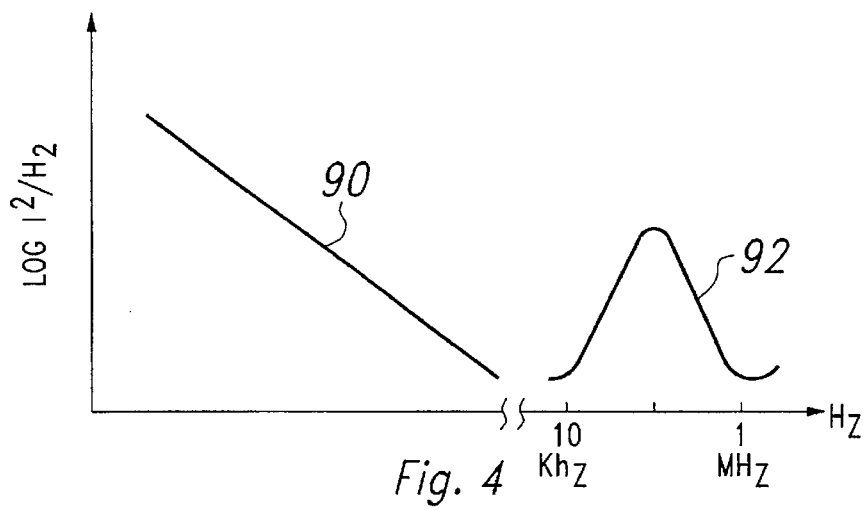
Fig. 4
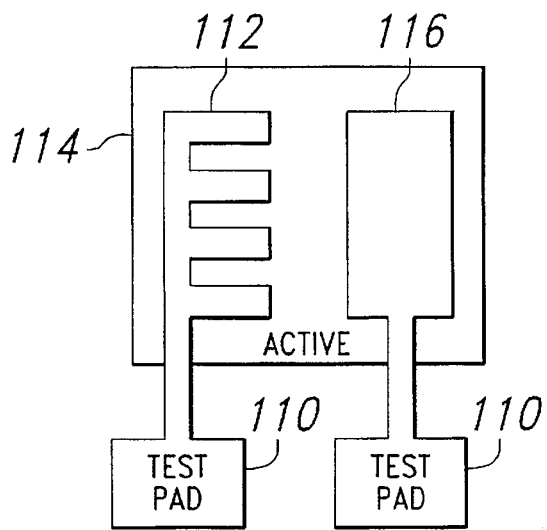
Fig. 7a
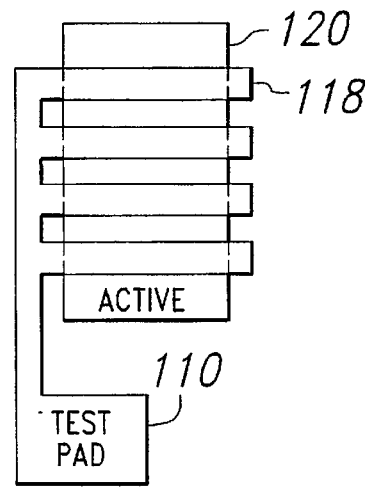
Fig. 7b
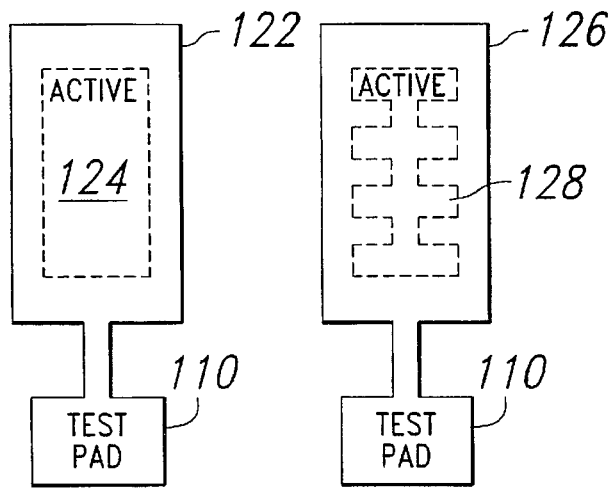
Fig. 7c
Fig. 7d

METHOD FOR DETECTING DEFECTS IN SEMICONDUCTOR INSULATORS

This is a division of application Ser. No. 08/109,202, filed Aug. 19, 1993.

TECHNICAL FIELD OF THE INVENTION

This invention pertains to methods for the manufacture of integrated circuits, and in particular to methods including the reliability testing of thin insulative films (for example, silicon dioxide) that are included in such circuits.

BACKGROUND OF THE INVENTION

There are various methods for detecting defects in, and thus testing the future reliability of, thin film insulators in integrated circuits, particularly insulators in memory devices. Memory devices include EPROMs, EEPROMs, DRAMs, and other products with nonvolatile memory. Unfortunately, existing wafer-level-reliability monitors of oxide breakdown voltage are not good predictors of oxide reliability, are slow, and are destructive.

One type of reliability testing is called "burn-in". In a burn-in test, the integrated circuit is subjected to elevated temperatures before performing functional tests on the integrated circuit. Currently, an integrated circuit undergoing a burn-in test is subjected to an elevated temperature for several hours. Because a large amount of time is required for a burn-in test, functional testing is usually performed before a burn-in test is performed. Later, burn-in tests and other tests for material defects are performed on samples in a group, or batch, of integrated circuits which have already undergone functional testing.

Scanning electron microscope ("SEM") views of semiconductor surfaces provide detailed information about the structure of the device, but require the destructive slicing of the die to expose the cross sectional view. Much time is required to prepare and analyze the many SEM photographs needed to adequately represent an entire semiconductor.

Charge-to-breakdown ("QBD") measurements force a constant current through a MOS capacitor and monitor the voltage across the capacitor until the insulator saturates, anywhere from five to thirty minutes later. This test destroys the capacitor, and is not sensitive to any bursts of current. These QBD measurements also do not correlate well with oxide failures.

Gate-oxide-integrity (GOI) tests apply ever-increasing "steps" of voltage across a MOS capacitor and monitor the current at each step. This test takes about 30 seconds, and although it gives an indication of the average strength of the oxide, it suffers the limitation that it destroys the capacitor, and it stresses the oxide with much higher electric fields than those applied in a typical application, thereby not testing for defects which cause reliability failures at low electric fields. The GOI test result also depends on step duration as well as voltage.

Other methods of oxide characterization rely on DC measurements which typically only detect the minimum Si-$SiO_2$ barrier height, and in fact may miss the true minimum if self-healing occurs. A short test method is needed to predict oxide properties in order to improve reliability.

Sze, in Chapter 7 of his text, "Physics of Semiconductor Devices", 2d Ed., summarizes basic conduction processes in insulators, listing (in table 4 on page 403) six conduction processes, three of which depend on a factor called "barrier height". Interface currents dominated by barrier height have been shown by Guttler and Werner to be related to the noise power density. A similar effect is observed for thin insulators which conduct by Fowler-Nordheim tunneling.

Several studies have found that the noise level is governed by the interface-state density and in general suggested the noise in the MOS transistor is a surface effect.

Amberiadis et al. conducted noise measurements in $P^-$ type diffused and ion-implanted MOS capacitors. They found that there are three sources of 1/f noise: (1) number fluctuation 1/f noise (due to the interaction of holes with the surface oxide); (2) bulk mobility fluctuation 1/f noise (due to the fluctuation in the bulk mobility); and (3) modulation 1/f noise (when inversion becomes important electrons in the inversion layer begin to interact with oxide traps, giving rise to fluctuations in the surface potential, which in turn gives a 1/f modulation of the surface mobility, or a direct modulation of the bulk resistance). Kostas Amberiadis and Aldert Van Der Ziel, "1/f Noise in Diffused and Ion-Implanted MOS Capacitors", *Solid-State Electronics*, Vol. 26, No. 10, pp. 1009–1017 (1983).

Neri et al. disclose a method for measuring low-frequency noise, and state that "low-frequency noise measurement is a very useful, non-destructive, and alternative tool in analyzing electrical and structural properties of electron devices and materials", and that weak spots in thin thermal oxide "are characterized by a notable local lowering of the barrier height". B. Neri, P. Olivo, and B. Ricco, "Low-frequency noise in silicon-gate metal-oxide-silicon capacitors before oxide breakdown", *Appl. Phys. Lett.*, Vol. 51, No. 25, pp. 2167–2169 (1987). However, they do not describe how the measurement determines barrier height, or how it determines the minimum barrier height, or how those measurements affect the reliability of the electron device.

Butler et al. have derived an expression for the drain voltage noise for an $N^-$ channel MOSFET using a trap-induced-number-fluctuation theory. Z. Celik-Butler and T. Y. Hsiang, "Spectral Dependence of $1/f_y$ Noise On Gate Bias In $N^-$ MOSFETS", *Solid-State Electronics*, Vol. 30, No. 4, pp. 419–423 (1987). However, they do not discuss any such relationship for capacitors.

Van Der Ziel states that "in MOSFETs electrons tunnel from traps in the oxide, at a distance z from the interface, to the conducting channel and vice versa. . . . The electrons must climb a potential barrier before they can reach the surface and interact with oxide traps. The 1/f noise is therefore reduced, and this becomes more pronounced near saturation. . . . Most MOSFETs have surface 1/f noise and most bulk semiconductor resistors have volume 1/f noise. . . . Surface 1/f noise can be turned off and on. The trapping of carriers in the surface oxide can also give rise to surface potential fluctuations, and hence to mobility 1/f noise." Aldert Van Der Ziel, "Unified Presentation of 1/f Noise in Electronic Devices: Fundamental 1/f Noise Sources", *Proceedings of the IEEE*, Vol. 76, No. 3, pp. 233–258 (1988).

Young et al. have disclosed that "nitride-oxide stacked films can be thought of as an oxide film with electron trapping at the nitride/oxide interface. The density of electron trapping is determined by the current-continuity requirement." K. K. Young, Chenming Hu, and William G. Oldham, "Charge Transport and Trapping Characteristics in Thin Nitride-Oxide Stacked Films", *IEEE Electron Device Letters*, Vol. 9, No. 11, pp. 616–618 (1988).

Wong & Cheng state that "it is possible to apply the low-frequency noise measurement to estimate the oxide-trap distribution. . . . Low-frequency noise in MOS systems indeed originates from the oxide traps, at least partially if not dominantly, rather than solely from interface-state density." H. Wong and Y. C. Cheng, "Gate dielectric-dependent flicker noise in metal-oxide-semiconductor transistors", *J. Appl. Phys.*, Vol. 67, No. 2, pp. 863–867 (1990).

Electronic properties of Schottky diodes depend sensitively on spatial inhomogeneities of the metal/semiconductor interface. Güttler et al. disclose that "excess noise increased drastically when the standard deviation $\sigma_s$ of the spatial distribution of Schottky barrier heights exceeds the critical threshold value of 2kT". Herbert H. Güttler and Jürgen H. Werner, "Influence of Barrier Inhomogeneities on Noise at Schottky Contacts", *Appl. Phys. Lett.*, Vol. 56, No. 12, pp. 1113–1115 (1990).

Dreyer et al. disclose a method for measuring the integrity of semiconductor multi-layer metal structures. They disclose "forcing direct current flow through a semiconductor metal structure. Voltages with generally non-periodic frequencies are generated by the current flow and are converted to a voltage spectral density. This voltage spectral density is then compared to the voltage spectral density of a defect free metal structure. A larger voltage spectral density value for the test sample indicates the presence of defects in its metal structure." U.S. Pat. No. 5,049,811, entitled "Measuring Integrity of Semiconductor Multi-layer Metal Structures", to Dreyer et al. (1991).

Gutt et al. also disclose testing metal films by measuring 1/f noise. They disclose "causing a direct current and an alternating current to flow in the test portion, the combined currents being of sufficient magnitude to stimulate $1/f^2$ noise in the test portion; determining the noise spectrum associated with the alternating current; and comparing the slope and amplitude of the spectrum with predetermined values at one or more preselected frequencies." U.S. Pat. No. 5,057,441, entitled "Method For Reliability Testing Integrated Circuit Metal Films", to Gutt et al. (1991).

Dreyer et al. and Gutt et al. disclose testing a conductor by passing current through it. Thus, this is somewhat duplicative of what occurs in the normal operation of that conductor.

Currently functional tests are performed on integrated circuits before those integrated circuits are tested for material defects. This is because the testing for material defects takes too much time. The unfortunate result of this compaction of production scheduling is that during or after functional testing of an integrated circuit, it will be discovered that the integrated circuit has a material defect, such as a defective MOS capacitor. Each functional testing machine costs in excess of $2 million. Thus, because of the usually limited number of functional testers, functional testing becomes a bottle-neck in the production of integrated circuits. If integrated circuits having material defects could be discovered before functional testing, this would speed up production of integrated circuits, because functional testing would not be performed on defective integrated circuits. Thus, a need exists in the art for a way to quickly test the material of an integrated circuit before that integrated circuit undergoes functional testing.

The invention overcomes the above-noted and other drawbacks of the prior art by providing a method and apparatus for determining the reliability of insulators in integrated circuits with noise measurements. The preferred embodiment of the method of the present invention uses all current flow as it contributes to the complete noise spectrum. Noise measurements of oxide current can give the mean and sigma of the barrier height which regulates tunneling. This is very sensitive to oxide defects which allow some current to flow, then self-heal, because the noise spectrum is broadened by temporal spikes. These current spikes can cause failures in floating gate and DRAM memory cells.

The preferred embodiment of the method of the present invention provides a true reliability indicator which can be used for sample screening and process improvement. The preferred embodiment of the method of the present invention eliminates the undesirable feature common to existing methods wherein the MOS capacitor being tested is destroyed. The invention is the first method for testing the reliability of semiconductor insulators which does not have to wait until the device fails before a reliability determination can be made. The present invention is believed to be the first method that allows for testing of the material of every integrated circuit being produced before that integrated circuit undergoes functional testing. The method of the present invention is further believed to be the first method which allows for testing the material of the integrated circuit during the actual production of the integrated circuit, thus allowing improvements to be made in the production of an integrated circuit while that particular integrated circuit is being produced.

SUMMARY OF THE INVENTION

In the preferred embodiment of the method of the present invention, a constant voltage source is applied across the thin film insulator. A low noise amplifier is connected across a resistor which is in series with the insulator. A spectrum analyzer is connected to the low noise amplifier. The power density is obtained by observing the output of a spectrum analyzer. The current spectral density is compared to a predetermined reference to detect the presence of defects in the insulator. In another aspect of the invention, a burst detector is used to compare current amplitude to the running average in the time domain. In yet another aspect of the invention, the defects detected include both material and structural defects. In yet another aspect of the invention, the method is used in designing integrated circuits by comparing various structures to select the most defect-free structure. The preferred embodiment of the method of the present invention can be used for testing any integrated circuit, including EPROMs, EEPROMs, DRAMs, logic chips, microprocessors, products with nonvolatile memory, and any other products using thin gate insulators.

In yet another aspect of the invention, integrated circuits are produced by testing the reliability of semiconductor insulators in an integrated circuit, and modifying the production process, before the integrated circuit undergoes the final stages of production. In yet another aspect of the invention, integrated circuits are produced by testing every integrated circuit for material defects before the integrated circuit undergoes functional testing.

BRIEF DESCRIPTION OF THE DRAWINGS

The above-noted and other aspects of the present invention will become more apparent from a description of the preferred embodiment, when read in conjunction with the accompanying drawings. The drawings illustrate the preferred embodiment of the invention. In the drawings the same members have the same reference numerals.

FIG. 4 is a graph of the current spectral density of a defective insulator.

FIGS. 7(a–d) are plan views of different physical structures of gates and thin oxides in memory cells, which structures can be tested according to the method of the present invention.

DETAILED DESCRIPTION OF THE PREFERRED EMBODIMENT OF THE INVENTION

Figure 1A:
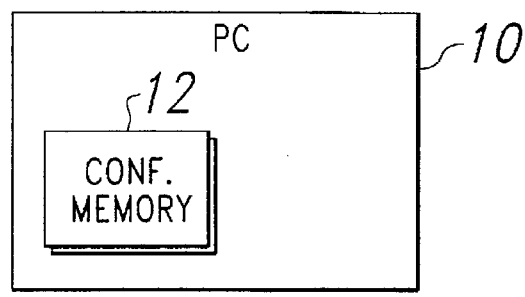
FIGS. 1(a–d) are a series of figures depicting the location within a personal computer of a MOS capacitor of a memory device, the capacitor having been tested for reliability according to the method of the present invention.
Figure 1B:
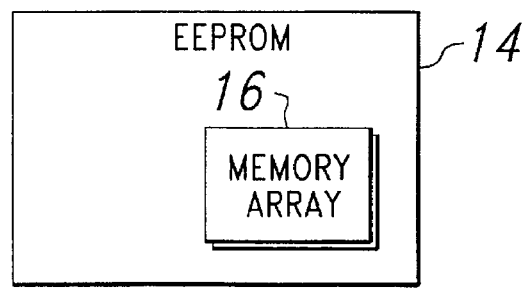
Figure 1C:
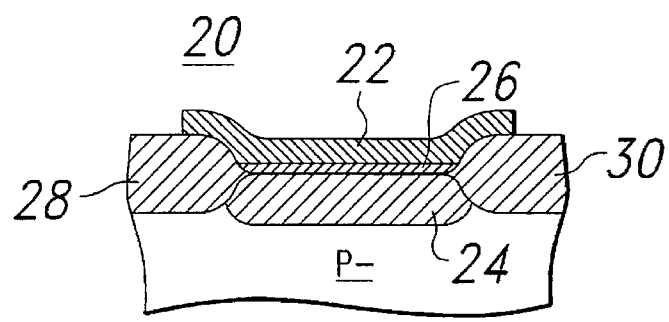
Figure 1C:
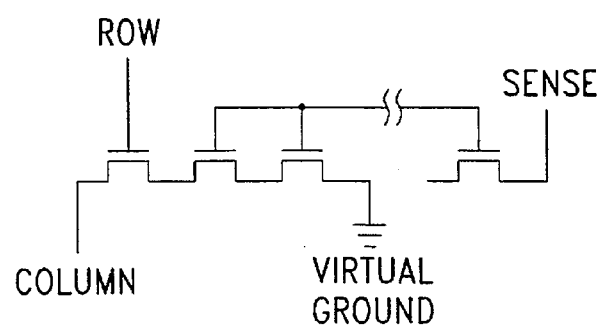

FIG. 1(a) depicts a personal computer (PC) 10 which has a configuration memory 12, as do most personal computers. The configuration memory can contain any of a number of memory devices, including EPROMs, EEPROMs, DRAMs, and other products with nonvolatile memory. FIG. 1(b), as an example, depicts an electrically-erasable-programmable-read-only-memory (EEPROM) 14, which is part of the configuration memory 12. The EEPROM contains a memory array 16. FIG. 1(c) depicts a memory cell 18 within the memory array 16. FIG. 1(d) depicts a cross-sectional view of one of the MOS capacitors 20 in the memory cell 18. Between a polysilicon gate 22 and an $N^-$ diffusion 24 is a thin oxide film, or insulator 26. The insulator is also bounded on either side by field oxides 28, 30. The thickness of the insulator 26 is approximately 100 angstroms. The insulator's reliability is critical to the performance of the EEPROM 14. The method of the present invention checks the reliability of the insulator 26 by testing the insulator 26 in the product chip under test. The preferred embodiment of the present invention checks the reliability of the insulator by testing a similar structure in a process monitor, fabricated on the same wafer as the product chips.

Figure 2:
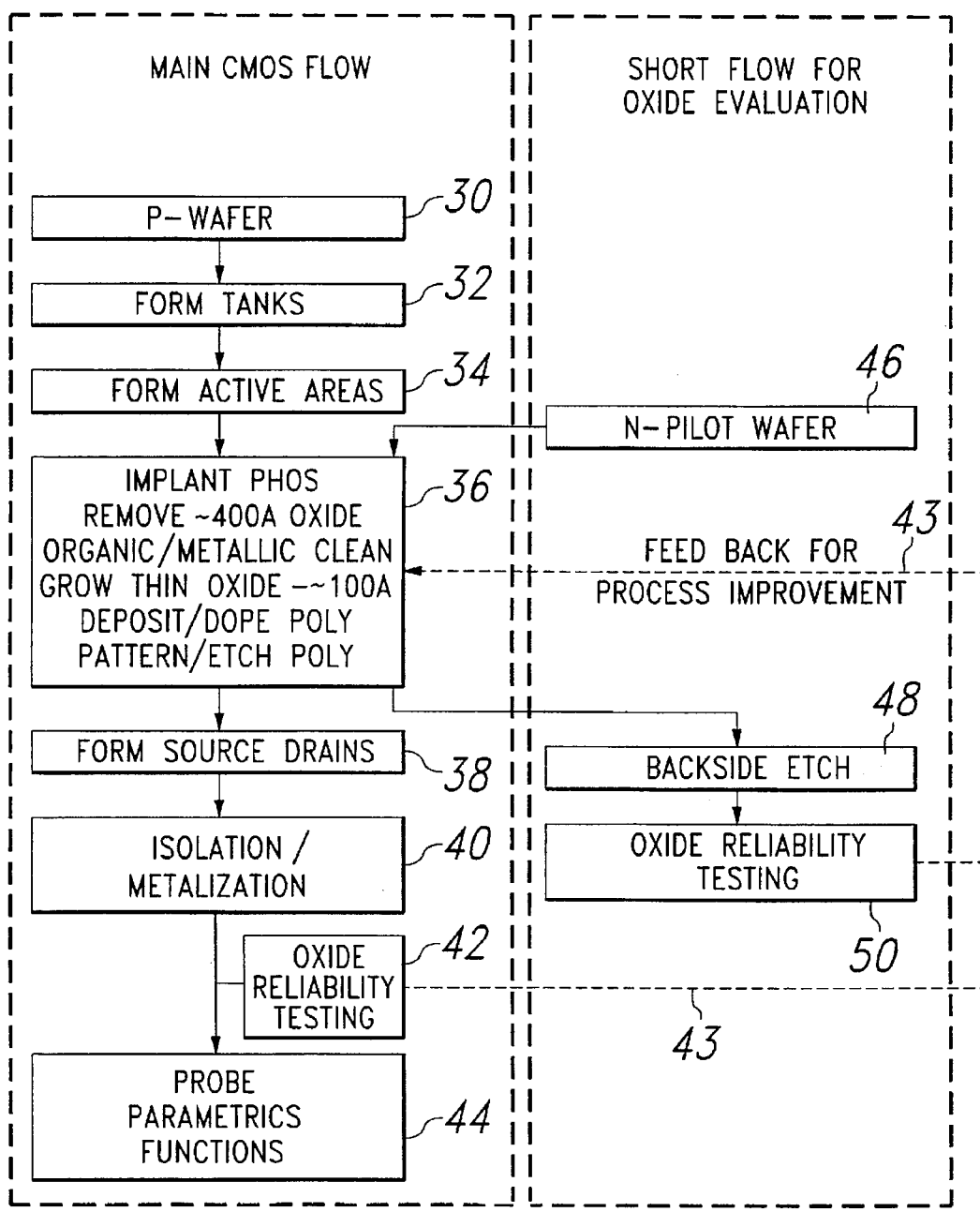
FIG. 2 is a flow diagram of the manufacturing process of an integrated circuit, according to the method of the present invention.

FIG. 2 is a flow diagram of the manufacturing process of an integrated circuit, according to the preferred embodiment of the method of the present invention. The process shown is for a CMOS integrated circuit, but a similar process can be used for any integrated circuit. The process begins with the selection of a $P^-$ wafer, step 30. In step 32, $N^-$ and $P^-$ tanks are formed for PMOS and NMOS transistors, respectively. In step 34, active regions for capacitors, source/drains, and channels are formed, isolated by field oxide. Then, in step 36, the following actions are taken. A dopant such as phosphorus is implanted in selected active areas. After the implantation, about 400 angstroms of oxide are removed. After cleaning, a thin oxide film, or insulator, about 100 angstroms thick, is grown in each active area. Then, polysilicon is deposited and doped. The desired gate structural pattern is etched by removing polysilicon, thus forming the gates of each individual device.

Then, in step 38, for each device, a source and a drain is formed. In step 40 isolation oxide is deposited, contact windows patterned and etched, and metal is deposited, patterned, and etched. Finally, a protective overcoat is deposited, and bond pad openings are patterned and etched. After step 40, the oxides, or insulators, such as insulator 26, are tested in step 42 for reliability. The dashed line 43 from the box representing the testing step 42 indicates that the results of the testing are used as "feedback" to improve the cleanup and oxidation steps of step 36 of the manufacturing process. After the insulators are tested, in step 44 parametric probing is done on the process monitor structures. Chip functions are tested in the final probing operation.

Referring now to step 46, there are depicted the steps in evaluating oxides, or insulators, on a short flow $N^-$ pilot wafer. After the selection of an $N^-$ wafer in step 46, step 36 is repeated. Then, in step 48, the backside of the wafer is etched for the purpose of making contact to the $N^-$ silicon. Then, just as in step 42, the oxides are tested for reliability in step 50. Again, the dashed line 43 indicates a feedback loop for improving the manufacturing step 36.

Figure 3:
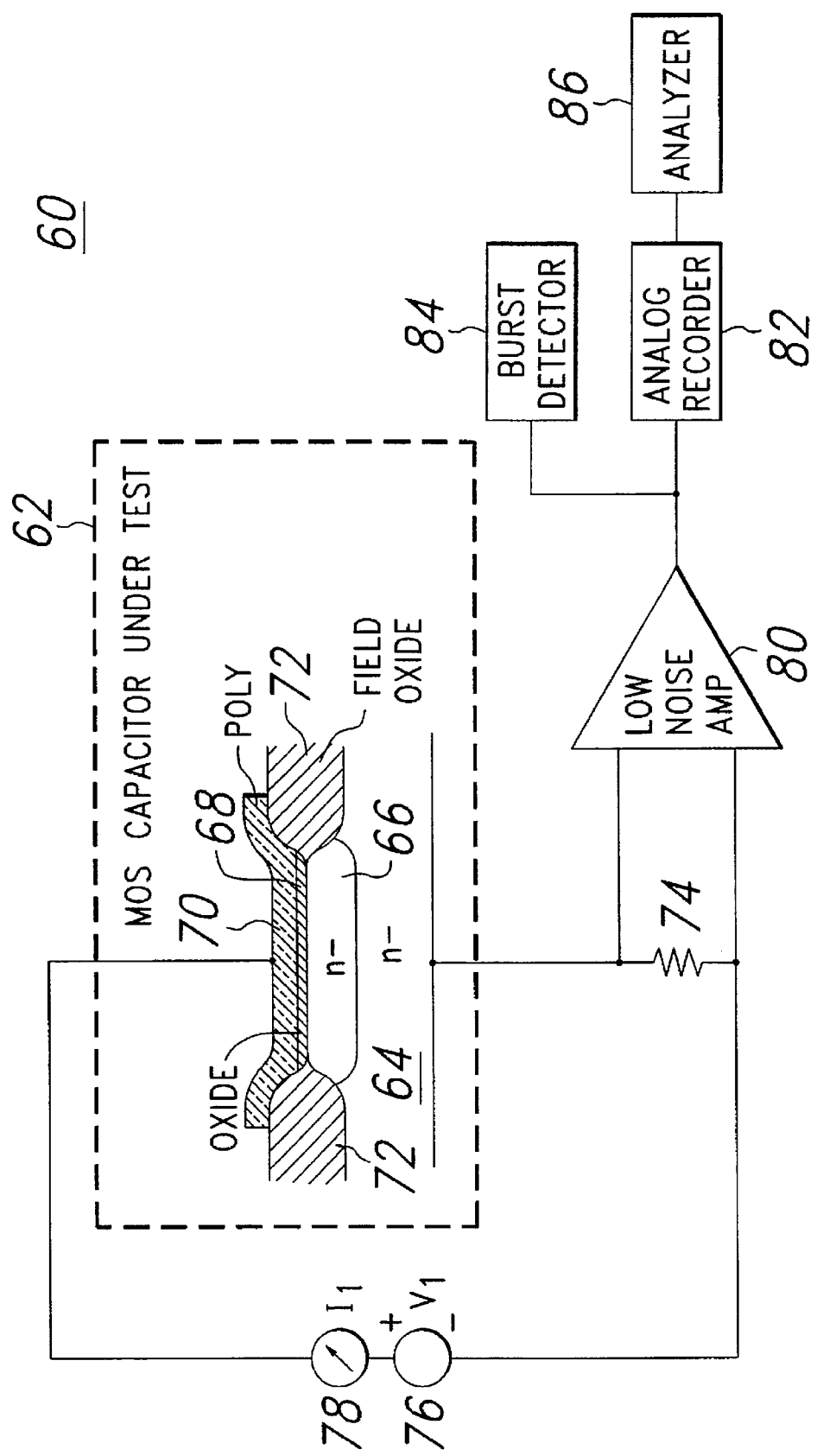
FIG. 3 is a schematic diagram of the components used in the method of the present invention.

Referring now to FIG. 3, a schematic diagram 60 depicts the components used in the testing method of the preferred embodiment of the present invention. Although only a short flow capacitor 62 is shown, it is to be understood that the actual memory device structure is preferably tested on a process monitor on the chip being tested. However, provisions for testing actual cells in a memory array can be done by any architecture and decoder design.

The structure to be tested is a MOS capacitor 62. The MOS capacitor 62 has an $N^-$ substrate 64, on which is an $N^-$ diffusion 66. On top of the $N^-$ diffusion is a thin oxide layer, or insulator, 68. A polysilicon gate 70 has been deposited on top of the insulator 68. A field oxide 72 is at either end of the insulator 68.

A resistor 74 is placed in series with the $N^-$ substrate 64. A constant DC voltage source 76 is applied to the resistor 74 and the polysilicon gate 70. An ammeter 78 in series with the voltage source is used to confirm that the DC current is at least one microamp per square centimeter, thus indicating that the capacitor 62 is not shorted or open. In one embodiment of the capacitor structure, the constant DC voltage source 76 is selected so that an electric field is formed across the capacitor which has a value in the range of four to twelve megavolts per centimeter. A low noise amplifier 80 is connected across the resistor 74. The amplifier 80 can be any low noise amplifier, such as a Brookdeal Model No. 5003. Connected to the output of the amplifier 80 is an analog recorder 82, such as analog recorder Model No. PR220, manufactured by Ampex. Also connected to the output of the amplifier 80 is a burst detector 84. The burst detector is simply an amplitude comparator. Connected to the output of the analog recorder 82 is a spectrum analyzer 86, such as signal analyzer Model No. HP3562A, manufactured by Hewlett Packard.

The test consists of measuring and recording the AC component of the current, as a voltage drop across the resistor 74. Then, the person testing compares the current spectral density shown by the spectrum analyzer 86 with a predetermined reference, that is, with the current spectral density for the flicker noise of a MOS capacitor known to be reliable. The flicker noise is believed to be caused by transitions of localized states in the tunneling barrier. If the measured spectral density fits the model, the insulator 68 in the MOS capacitor 62 passes the test, and is noted as reliable. In an alternate embodiment of the method of the present invention, the burst detector 84 monitors random current fluctuations. If the magnitude of the fluctuations exceed 1% of the running average DC current, then the burst detector 84 detects the fluctuations, and the insulator 68 in the capacitor 62 is rejected as unreliable.

Referring now to FIG. 4, a graph of the current spectral density of a defective insulator is illustrated. The x axis is frequency. The y axis is the log of the square of the current divided by the frequency. The x-axis is not drawn to scale. Furthermore, it shows a break before 10 kilohertz. The spectrum analyzer will show the line 90 on one screen. Line 90 represents a spectral density over a frequency range of approximately one tenth hertz to one hundred hertz. Such line indicates that the insulator in a capacitor may be reliable. However, the current spectral density above ten kilohertz also needs to be checked. If the spectral density above ten kilohertz appears like the spectral density curve 92 shown in FIG. 4 above ten kilohertz, then the insulator is unreliable. The curve 92 begins rising in amplitude around 10 kilohertz, and falls back to its beginning amplitude around one megahertz. Thus, the current spectral density of an insulator being tested may be compared to a predetermined reference spectral density across a frequency range from one tenth hertz to 1.2 megahertz. A faster way than using the spectrum analyzer to check the current spectral density above ten kilohertz is to use the burst detector. A response by the burst detector indicates that there is a spectral density pattern above ten kilohertz similar to the curve 92 shown in FIG. 4.

Figure 5:
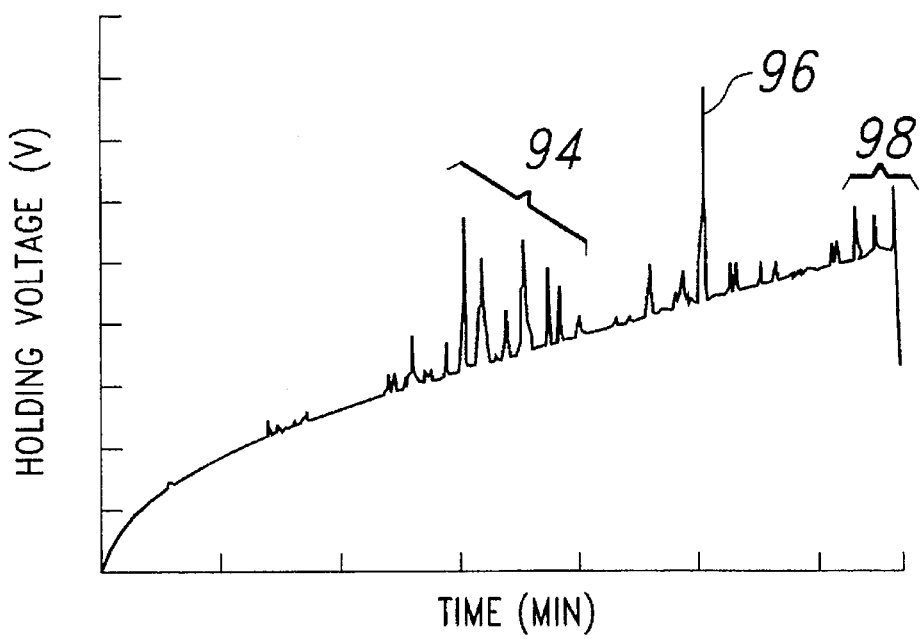
FIGS. 5 and 6 are graphs of voltage across defective semiconductor insulators in QBD tests.
Figure 6:
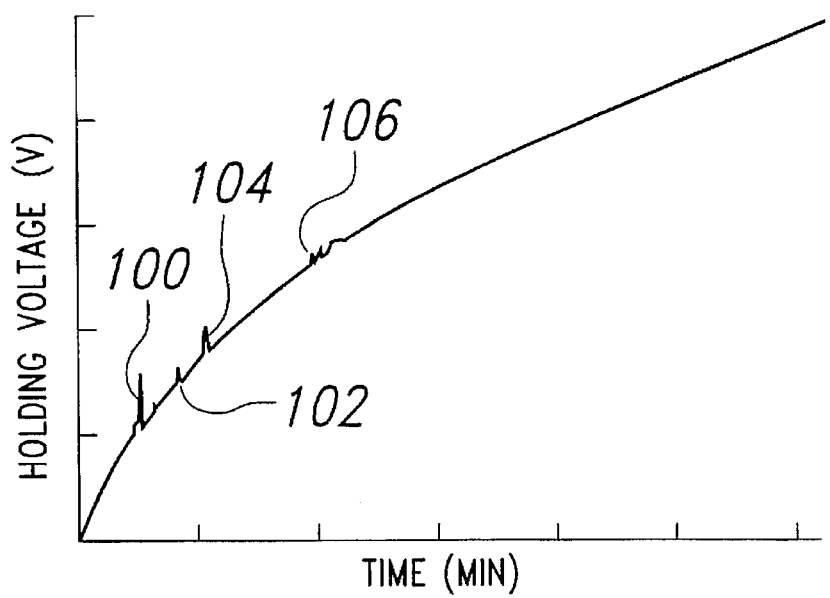

FIGS. 5 and 6 are graphs of voltage across two different unreliable semiconductor insulators in QBD tests. FIG. 5 indicates the presence of current spikes 94, 96, and 98, which can be detected by the burst detector 84. Dips in current result in spikes in voltage. FIG. 6 indicates another unreliable oxide with current spikes 100, 102, 104, and 106 occurring earlier in the testing.

FIGS. 7(a-d) are plan views of different structures of gates and thin oxides, or insulators, in memory cells, which structures can be tested according to the method of the preferred embodiment of the present invention. The material of the insulator is not the only factor that can contribute to unreliability. The physical structure of the gate, and the relationship of the size of the gate to the oxide are also factors that can contribute to unreliability of the insulator in an application. The insulators are all labeled "active" in FIG. 7. The gates are formed as part of test pads 110. The pads 110 measure approximately four mils by four mils, and serve as contact points for testing the gates. FIG. 7(a) depicts on the left a gate 112 with many corners overlaid on a larger insulator 114, being tested in comparison with, on the right, a gate 116 with much fewer corners. FIG. 7(b) depicts a gate 118 with a large perimeter of field oxide 120. FIG. 7(c) depicts a gate 122 overlaid on a smaller insulator 124, the insulator 124 having few corners. FIG. 7(d) depicts a gate 126 overlaid on a smaller insulator 128, the insulator 128 having many more corners than the insulator 124 of FIG. 7(c). The method of the preferred embodiment of the present invention can be used to compare the relative reliability of all these physical structures, and of any other layout. Thus, the method of the preferred embodiment of the present invention can be used not only in the manufacturing, but also in the design of integrated circuits.

The principles, preferred embodiment, and modes of operation of the method of the present invention have been described in the foregoing specification. The invention is not to be construed as limited to the particular forms disclosed, because these are regarded as illustrative rather than restrictive. Moreover, variations and changes may be made by those skilled in the art without departing from the spirit of the invention.

What is claimed is:

1. A method for designing an integrated circuit, comprising:
   a. selecting a plurality of possible gate and insulator structures;
   b. providing at least one semiconductor substrate to be processed;
   c. processing the substrate, the processing step including the step of forming at least one of each of the possible insulator structures on the substrate;
   d. evaluating each of the possible insulator structures, the step of evaluating comprising:
      i. applying a non-destructive voltage across the insulator structure to be evaluated;
      ii. measuring currents induced by the voltage;
      iii. determining current spectral density of the measured currents; and
      iv. detecting the presence of defects in the insulator structure by comparing the current spectral density to a predetermined reference current spectral density for a known defective insulator structure;
   e. for each insulator structure, comparing the results from the evaluating step with the results from the evaluating step for the other insulator structures; and
   f. Selecting a preferred one of said plurality of possible gate and insulator structures based on said comparing step.

2. the method of claim 1 wherein the step of applying voltage includes applying an electric field in the range of four to twelve megavolts per centimeter.

3. The method of claim 1 wherein the step of comparing the current spectral density to a predetermined reference includes comparing within a frequency range of from one-tenth hertz to 1.2 megahertz.

4. The method of claim 1 wherein the step of comparing the current spectral density to a predetermined reference includes comparing within a frequency range of from one-tenth hertz to one hundred hertz.

* * * * *